United States Patent [19]

Lattin

[11] 3,708,689

[45] Jan. 2, 1973

[54] VOLTAGE LEVEL TRANSLATING CIRCUIT

[75] Inventor: William W. Lattin, Phoenix, Ariz.

[73] Assignee: Motorola, Inc., Franklin Park, Ill.

[22] Filed: Oct. 27, 1971

[21] Appl. No.: 192,806

[52] U.S. Cl. ....................................307/205, 307/251
[51] Int. Cl. ..............................................H03k 17/60
[58] Field of Search ...............307/205, 251, 279, 304

[56] References Cited

UNITED STATES PATENTS

| | | | |
|---|---|---|---|
| 3,355,721 | 11/1967 | Burns | 307/304 X |
| 3,480,796 | 11/1969 | Polkinghorn et al. | 307/205 X |
| 3,590,273 | 6/1971 | Jaruis | 307/251 X |
| 3,591,857 | 7/1971 | Jarvis | 307/251 |
| 3,610,964 | 10/1971 | Hatano et al. | 307/279 |

*Primary Examiner*—John S. Heyman
*Attorney*—Foorman L. Mueller et al.

[57] ABSTRACT

The buffer circuit, which can convert TTL logic levels to MOS logic levels, includes four low threshold MOS transistors. Two of these devices are connected between positive and negative supplies in the configuration of a MOS inverter circuit, and the third device forms an output switch connected to the buffer input, the inverter output, and the buffer output terminals. The fourth device is connected in a MOS load configuration between the drain of the third device and the negative supply. The output switch device amplifies a small change in voltage at the drain of the inverter switch device occurring in response to a TTL "one," to enable its load to apply a MOS "one" to the output. Because of the configuration of the circuit, the inverter load device can have a high resistance and the "body-effect" of the output switch device tends to increase its threshold voltage in the nonconductive state, thus making it less responsive to noise signals.

8 Claims, 3 Drawing Figures

VOLTAGE LEVEL TRANSLATING CIRCUIT

BACKGROUND OF THE INVENTION

An interface or buffer circuit is required in many recent electronic systems for shifting the voltage levels of logical "ones" and logical "zeros" developed by a logic system connected to its input to other magnitudes suitable for driving another kind of logic system connected to its output. For example, a buffer circuit is required for interfacing transistor-transistor logic (TTL) with low threshold metal-oxide semiconductor (MOS) circuits. To perform this function, the interface circuit must convert an input TTL "zero" signal having an amplitude within the range from 0 to plus 0.4 volts to a MOS "zero" output signal having an amplitude on the order of plus 5 volts, and a TTL "ones" having an amplitude from plus 2.6 to plus 5 volts to a MOS "one" signal having an amplitude on the order of minus 12 volts. Moreover, it is desirable that the foregoing level transformations be rapidly effectuated by a circuit which takes up minimum space and which requires minimum power for its operation.

In the past, voltage level transformation has been accomplished by "metal-gate" MOS buffer circuits including P-channel, enhancement mode devices having high threshold voltages ($V_{Th}$) which are greater than 2.4 volts. More specifically, such inverter circuits often include a switch device and a load device connected in series to form a MOS inverter. The source of the switch device is connected to a positive voltage on the order of 5 volts and the drain of the load device is connected to a negative voltage on the order of 15 volts. The output terminal is located between the switch and load devices. A TTL "zero" applied to the gate of the switch transistor renders it conductive and the positive source voltage is applied to the output terminal. Moreover, since the switch device has a threshold voltage which is greater than 2.4 volts, even when the worst case TTL logic "one" is applied to its gate, the switch device is rendered nonconductive and the negative voltage is applied by the load device to the output terminal.

Recently much interest has been shown in "silicon-gate" MOS devices which have threshold voltages less than 2.4 volts. These devices are advantageous in many applications because their lower threshold voltages facilitate an increase in operating speed. Moreover, the "silicon-gate"process provides a simplification in manufacture and enable more devices to be fabricated in a given area than the "metal-gate" process. The lower threshold voltage, however, renders the above described inverter inoperative because the plus 2.6 volt TTL "one" level does not pull the gate of the low threshold switch device close enough to the plus 5 volt potential to turn the switch device "off." Thus a degraded negative voltage or MOS "one" occurs at the output terminal in response to the worst case TTL "one."

Prior art methods have been employed to guarantee the integrity of the logical "one" level conversions performed by P-channel, MOS low threshold inverter circuits. For example, one well known technique is to utilize a pull-up resistor connected between the plus 5 volt supply for the TTL circuit and the gate of the switch device. This resistor guarantees that the TTL "one" level will be on the order of plus 5 volts so that it can turn "off" the low threshold switch device. Although this technique solves the problem, it is often undesirable to provide a pull-up resistor, which must have a large value, on either the TTL chip or the MOS chip because the resistor tends to take up too much space.

Another prior art solution is to provide a plurality of cascaded low threshold inverters, each of which increases the 2.6 volt TTL "one" level as it is successively applied from the output to the input of each stage until the level finally is close enough to plus 5 volts to turn a switch device of one of the inverters "off." A large negative voltage or MOS "zero" is developed at the output of the "off" inverter which insures that any succeeding inverters also provide MOS "one" levels. Since each of the inverters presents additional capacitance to the TTL driving circuit, this technique tends to slow down the operation of the system. Furthermore, the plurality of inverters tend to take up an undesirable amount of chip area.

SUMMARY OF THE INVENTION

An object of this invention is to provide an improved level shifting circuit for converting the voltage magnitudes of logic levels of one system to different magnitudes required by another logic system.

Another object is to provide a level translating circuit which is comprised of low threshold, MOS devices and which takes up a minimum amount of space on an integrated circuit chip.

Still another object is to provide a buffer circuit for interfacing TTL logic circuits with low threshold MOS circuits, which buffer circuit operates at a relatively high speed as compared to prior art interface circuits.

A further object is to provide a low threshold buffer circuit which utilizes "body effect" to maintain a MOS "one" level at its output even though noise signals are applied to its input.

A still further object of this invention is to provide a low threshold, MOS buffer circuit which is reliable and sensitive to a small input voltage change to shift its output voltage levels between the MOS "one" and "zero" states.

In brief, the level translating circuit providing, for instance, MOS logical "one" and "zero" levels in response to TTL "one" and "zero" levels includes four MOS, low threshold FETs. Two of the FETs have their gate and drain electrodes connected together to form first and second MOS loads and the other two FETs form first and second MOS switches, each of which operates in cooperation with one of the load devices. The gate terminals of the two switches are connected to the input terminal of the level translating circuit and the drain of each of the switches is connected through one of the loads to a negative supply voltage. The source of the first switch is connected to a positive supply voltage, and the source of the second switch is connected to the drain of the first switch. The output terminal of the voltage level translating circuit is connected to the drain of the second switch. In its first mode of operation, i.e., in response to a TTL "zero," the circuit operates to apply the positive voltage coupled to the source of the first switch device through the two switch devices to the output terminal. In the second mode of operation, i.e., in response to a TTL "one," the second load device pulls the potential at the output terminal towards the negative supply voltage, thus providing a MOS "one" level.

DETAILED DESCRIPTION OF THE PREFERRED EMBODIMENT

Figure 1:
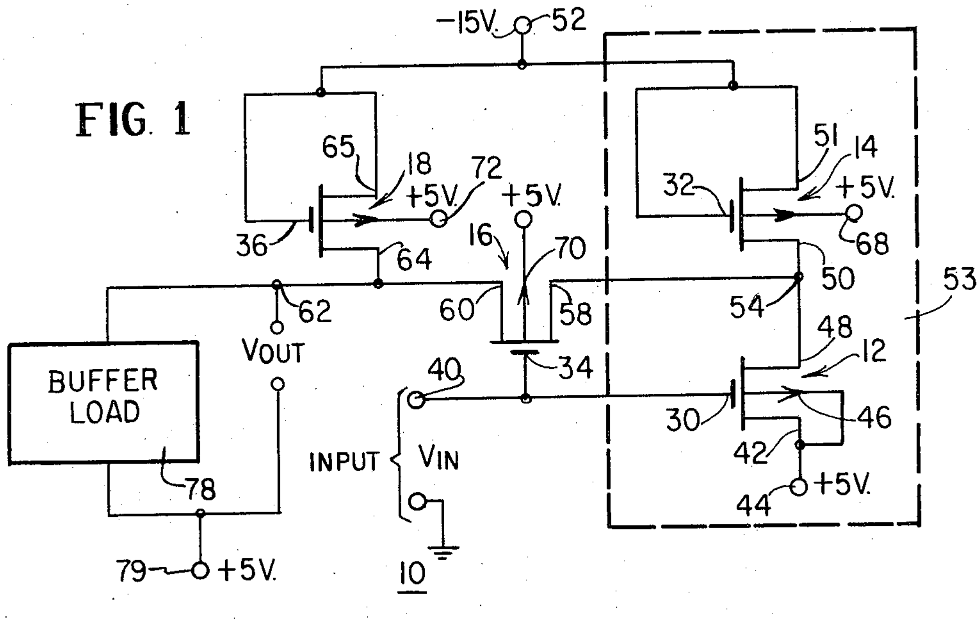
FIG. 1 is a schematic diagram of the voltage level translating circuit of one embodiment of the invention.
Figures 2, 3:
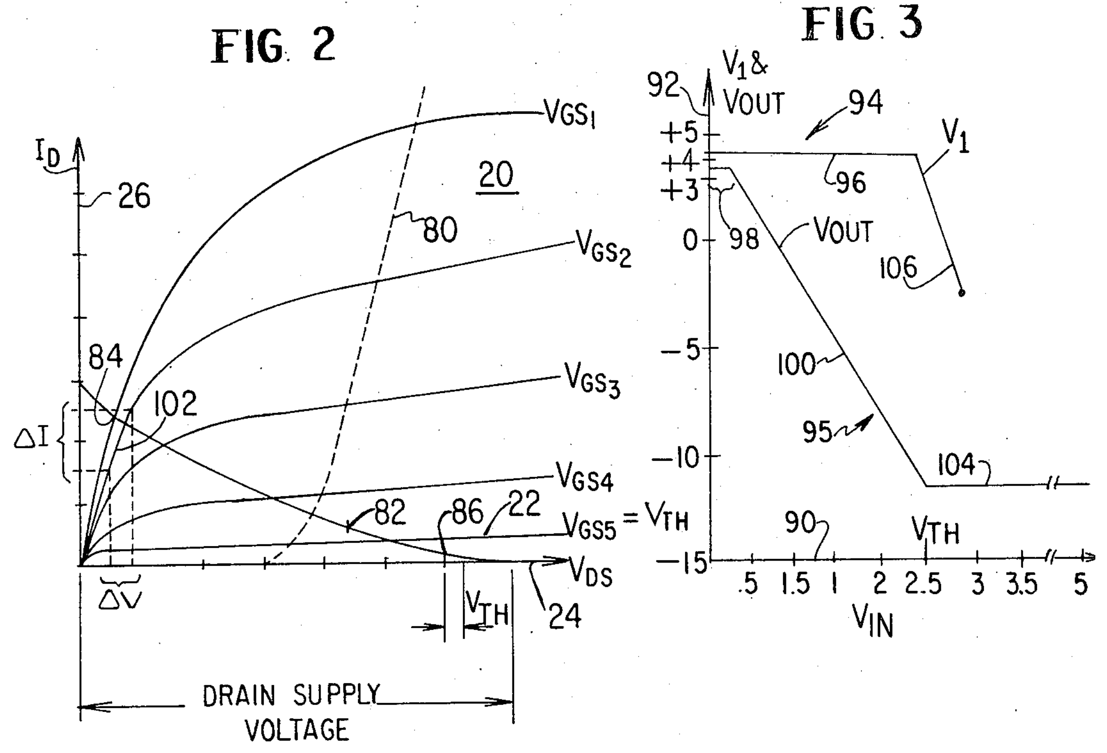
FIG. 2 depicts the characteristic curves of a P-channel, MOSFET showing the locus of operation of a MOS load and the MOS load line therefor.
FIG. 3 is a graph of the drain voltage level of the first switch device and the output voltage level of the level translating circuit of FIG. 1 as functions of the input voltage magnitude.

FIG. 1 shows a buffer or level translating circuit 10 comprised of P-channel, low threshold MOS devices 12, 14, 16 and 18 which may be fabricated by the "silicon-gate" process. A set of characteristic curves 20, which show the relationship between drain current, $I_D$, and voltage drain-to-source, $V_{DS}$, for given values of gate-to-source voltage, $V_{GS}$, of any one of devices 12 through 18, is shown in FIG. 2. Since each of devices 12 through 18 are enhancement mode, field effect transistors, (FETs), each of them is normally in an "off" or nonconductive state. To render one of the devices conductive, it is necessary that the voltage on its gate be made negative with respect to the voltage on its source by a predetermined magnitude which is equal to its threshold voltage ($V_{Th}$). Curve 22 of FIG. 2 illustrates the relationship between $V_{DS}$, which is measured along abscissa 24, and $I_D$ which is measured along ordinate 26, when $V_{GS}$ is equal to the threshold voltage $V_{Th}$.

The "silicon-gate" process enables the gates 30, 32, 34 and 36 of the FETs 12, 14, 16 and 18, respectively, to be formed from polycrystalline silicon. This process, which is known in the art, facilitates the manufacture of higher speed MOS devices which take up less space than devices formed by the "metal-gate" process. The increase in speed is accomplished partly because the "-silicon-gate" process results in MOS devices which have lower threshold voltages, i.e., between 1.5 and 2.5 volts, than devices formed by most other processes. Their low threshold voltage, however, creates a disadvantage when devices manufactured by the "silicon-gate" process are utilized in an inverter or buffer circuit for interfacing bipolar logic circuits with MOS logic circuits. The specifications for a logic "one" level of a TTL circuit is between plus 2.4 and plus 5 volts and the specification for a TTL logic "zero" is between 0 and plus 0.4 volts. To form a standard MOS inverter, the source of a MOS switch device is connected to the plus 5 volt supply, normally used with MOS circuitry. The drain of the switch is connected through a MOS load to the minus 15 volt supply, which is also normally used with MOS circuitry. Under these conditions, the plus 2.6 volts, or worst case TTL "one," is not sufficiently near the plus 5 volt source voltage to turn the low threshold switch device "off." Therefore, the required level shifting is not accomplished.

More particularly, referring to FIG. 1, P-channel MOS transistor 12 forms a first switch or driver having its gate 30 connected to buffer input terminal 40 and its source 42 connected to terminal 44 which is adapted to be connected to a plus 5 volt power supply. Substrate terminal 46 of device 12 is also connected to the plus 5 volt supply and its drain 48 is connected to source 50 of first MOS load 14. Gate 32 and drain 51 of first load 14 are connected to terminal 52, which is adapted to be connected to a minus 15 volt supply. This circuit, included in dashed block 53, is in the configuration of a prior art inverter circuit wherein the output is taken from terminal 54.

If a TTL "zero" is applied to input terminal 40, enhancement mode switch device 12 is rendered conductive because its gate 30 is more than 2.5 volts negative with respect to its source 42. Since low threshold device 12 is rendered conductive approximately plus 5 volts occurs at point 54. Thus, the inverter performs the desired level translation in response to a TTL "-zero." However, when a worst case TTL logic "one" which has a magnitude on the order of 2.6 volts is applied to input terminal 40, gate 30 is still 2.4 volts negative with respect to source 42. Therefore, device 12 remains at least partially conductive and the potential at output 54 remains either at a positive or a low magnitude negative voltage rather than being "pulled" by device 14 to the desired high magnitude negative voltage or MOS "one." Thus, the low threshold inverter 53 does not perform the desired level translation in response to a TTL one.

To overcome this problem, source 58 of second MOS switch or driver 16 is connected to terminal 54, gate 34 is connected to buffer input terminal 40 and drain 60 is connected to buffer output terminal 62. Furthermore, a second load device 18 is provided having a source 64 which is connected to drain 60 of second switch 16. Gate 36 and drain 65 of load device 18 are connected to terminal 52, which is adapted to be connected to the negative 15 volt supply.

Substrate terminals 68, 70 and 72 of respective devices 14, 16 and 18 are connected to the plus 5 volt supply. Buffer load 78 includes low threshold, MOS circuitry which may be included on the same chip as the level translating circuit and which is adapted to utilize the MOS logic levels occurring at buffer output terminal 62. For purposes of simplification, this load may be thought of as essentially being a capacitor connected from terminal 62 to the plus 5 volt supply terminal 79.

Curve 80 of FIG. 2 illustrates that the locus of operation of an enhancement mode load having $V_{GS} = {}_{VDS}$ is restricted to the saturation region. The $V_{DS}$ vs $I_D$ curve 82 is a load line for a P-channel load, e.g., device 14 or 18, which is superimposed upon the characteristic curve of a driver or switch device. e.g., device 12 or 16. Curve 82 represents the graphical solution of two simultaneous equations, i.e., the equation for the driver or switch device and the equation for the load device. The intersection of these two curves represents possible operating points for inverter circuit 53 of FIG. 1. The "on" or conductive operating condition of device 12 is designated by reference number 84 and the "off" or nonconductive operating condition is designated by reference number 86. The voltage across the driver or switch will be small as compared to the supply voltage when the driver is in its "on" condition, and when the driver is switched "off" the output voltage rises toward a value equal to the drain voltage minus the load threshold voltage, ($V_{Th}$). The reduction in possible output voltage swing occurs because a voltage approximately equal to $V_{Th}$ must be dropped across the gate-to-source of the load to initiate conduction.

FIG. 3 shows an abscissa 90 which is scaled to represent the voltage, $V_{in}$, which is developed between input terminal 40 and a reference potential of 0 volts. Ordinate axis 92 is scaled to measure the control voltage at terminal 54, $V_1$, as represented by curve 94, and the output voltage, $V_{out}$, as represented by curve 95 occurring at output terminal 62, both as a function of $V_{in}$. As shown by first portion 96 of curve 94, when $V_{in}$ is equal to 0 volts, i.e., in response to TTL "zero," control voltage $V_1$ is a little greater than 4 volts; and, as shown by first portion 98 of curve 95, the magnitude of voltage $V_{out}$ is about 3.5 volts. This is because with 0 volts at input terminal 40 and plus 5 volts at terminal 44, first switch 12 is conductive thereby providing a first control voltage 98 of a little less than plus 5 volts at terminal 54. Also, with 0 volts on the gate of second switch device 16, and a little less than 5 volts at its source, transistor 16 is also conductive thereby providing about plus 3.5 volts, at terminal 62. Thus the circuit of FIG. 1 translates a TTL "zero" to a MOS "zero."

As the magnitude of $V_{in}$ increases toward the TTL "one" level, the voltage at terminal 54 decreases slightly, as shown by the slope of portion 96 of curve 94, because first switch device 12 is not turned "on" as hard. Referring to segment 102 of the characteristic curve of FIG. 2 it can be seen that since device 12 is operating in the triode region, a slight increase in voltage thereacross, $\Delta V$ causes a relatively large decrease in current, $\Delta I$. Since device 14 is essentially a constant current source, because of its high resistance and constant voltage drop, and load 78 provides no DC path, this large decrease in current occurs in the path formed through second switch 16 and second load 18. Because the current through device 16 decreases and since the gate-to-source voltage of device 16 is also decreased, the output voltage tends to fall from about plus 3.5 volts to about minus 12 volts as indicated by portion 100 of curve 95 shown in FIG. 3, even though first switch 12 is still conductive. As shown by portion 104 of voltage output curve 95, when the input voltage reaches the threshold voltage of switch device 12, which is assumed to be on the order of 2.5 volts, the output voltage reaches approximately its negative-most value.

As $V_{in}$ increases above 2.5 volts, the voltage between gate 30 and source 42 of device 12 falls below the threshold value and device 12 begins to turn "off," i.e., its operation moves from point 84 toward point 86 on curve 82 of FIG. 2. As a result, the voltage, voltage $V_1$, changes from a positive value toward a negative value as shown by portion 106 of curve 94 of FIG. 3. Since the second switch 16 was virtually already cut off before the input voltage fell below the threshold voltage of device 12, $V_{out}$ remains essentially constant at the negative magnitude of approximately minus 11.5 volts. Hence, buffer level translator circuit 10 causes an absolute change in the amplitude of its output signal of approximately 15 volts in response to about a 2.5 volt change at input terminal 40. The output level of buffer circuit 10 is at least down to minus 10 volts which corresponds to a MOS "one" in response to a worst case TTL input voltage of 2.4 volts. The output level of a prior art inverter circuit including low threshold devices would only be down to about plus 3 volts in response to a plus 2.4 volt input signal. Hence, buffer level translating circuit 10 is sensitive to a small input voltage change to shift levels between the MOS "one" and "zero" levels. Since circuit 10 utilizes low threshold devices, it takes up a minimum amount of space and operates at maximum speed.

The configuration of FIG. 1 also utilizes "body-effect" to increase the threshold voltage of second switch device 16 so that it tends to remain nonconductive even in the presence of noise signals or other spurious signals which may be inadvertently applied to input terminal 40 along with a TTL logical "one." More specifically, "body-effect" refers to the modulation of channel conductance which results when a bias is applied between the source-to-substrate junction. Because a PN junction is formed by the source and drain diffusions to the substrate, some of the characteristics of the substrate tend to be like the gate of a junction FET. Increasing the magnitude of the reverse bias applied to the source-to-substrate junction tends to lower the magnitude of drain current for a given value of gate voltage. Hence, increasing the magnitude of the reverse bias tends to increase the threshold voltage of the devices of circuit 10. Substrate 68 of second switch transistor 16 is formed from N material and it is connected to a plus 5 volts. Moreover, source 58 of transistor 16 is formed from P material and connected to point 54. Thus, as control voltage $V_1$ increases in the negative direction in response to the threshold voltage of first switch device 12 being exceeded, as shown by portion 106, the source-to-substrate junction of device 16 is increasingly reverse biased. This causes the threshold voltage of switch 16 to increase and thereby tends to hold output switch device 16 in a nonconductive condition, even if noise pulses are applied to its gate 34 which could otherwise turn device 16 "on." Thus level translator circuit 10 of FIG. 1 utilizes "body-effect" or substrate bias to maintain a MOS "one" in response to a TTL "one."

Generally, conflicting considerations determine the choice of the amount of resistance to be provided by a MOS load device, e.g., transistors 14 and 18. The resistance presented by the load device cannot be too large or it will undesirably increase the resistance-capacitance time constant associated with changing the voltage across a capacitive load in response to a shift in output level. Alternatively, the value of resistance of the load device should not be too small because the size of its associated switch device would have to be increased so that most of the positive voltage would be developed at the output terminal when the switch device is "on." However, load device 14 of FIG. 1 does not have to charge an appreciable capacitance; therefore, it can have a high resistance which enables its associated switch device 12 to have a small geometry. Thus the level translating circuit of FIG. 1 takes up less space than otherwise would be the case.

The processing parameters for the circuit of FIG. 1, which has been found to be suitable for use in a commercial application are as follows:

oxide thickness, $t_{OX}$ = 1,000 A.
junction depth, $x_j$ = 1 micron
surface mobility = 200 $cm^2$/volt-sec
doping density, $N_D = 1.2 \times X10^{15}$ atoms/$cm^3$ The width to length ratios for the devices are as follows:

first switch device 12, 10 mil/0.3 mil
first load device 14, 0.3 mil/2.0 mil
second switch device 16, 10.0 mil/0.3 mil
second load device 18, 0.3 mil/0.4 mil What has been described therefore is a simple level shifting circuit which is suitable for translating TTL logic levels to MOS logic levels. This circuit is comprised of low threshold MOSFETS which take up a minimum amount of space on an integrated circuit chip, and it utilizes "body-effect" to maintain MOS "one" levels at its output even though noise signals are applied to its input. The circuit is sensitive to a small input voltage change to rapidly shift voltage levels between the MOS "one" and the "zero" states.

I claim:

1. A voltage level translating circuit providing between its output terminals a first output signal having a voltage level within a first predetermined range in response to a first input signal at its input terminal having a voltage level within a second predetermined range, and a second output signal having a voltage level within a third predetermined range in response to a second input signal having a voltage level within a fourth predetermined range, the voltage level translating circuit including in combination:

first switch means having first, second and control electrodes, said control electrode being connected directly to the input terminal;

first circuit means for applying a first supply voltage connected to said second electrode of said first switch means;

first load means having a first terminal connected to said first electrode of said first switch means and a second terminal;

second circuit means for applying a second supply voltage connected to said second terminal of said first load means;

second load means having a first terminal connected to one of the output terminals and a second terminal connected to said second circuit means;

second switch means having a first electrode connected directly to one of the output terminals and to said first terminal of said second load means, a control electrode connected to said control electrode of said first switch means, and a second electrode connected to said first electrode of said first switch means;

said first switch means respectively providing first and second control voltages at its first electrode in response to the first and second input signals; and said second switch means being rendered respectively conductive and nonconductive in response to said first and said second control voltages at said second electrode thereof and said first and second input signals at said control electrode thereof, to respectively provide the first and second output signals between the output terminals.

2. The voltage level translating circuit of claim 1 wherein said first and second switch means respectively include first and second low threshold, metal oxide semiconductor transistor devices each having source, gate, drain and substrate electrodes.

3. The voltage level translating circuit of claim 2 wherein said substrate terminal of said second transistor is connected to said first circuit means, said substrate and said source of said second transistor having conductivity types such that said second control voltage at said first electrode of said first transistor and said first supply voltage tend to reverse bias the source-to-substrate junction of said second transistor as it is rendered nonconductive so that the threshold voltage of said second transistor increases to hold said second transistor in a nonconductive state in response to the existence of the second input signal.

4. The voltage level translating circuit of claim 2 wherein said first and second transistors are of the P-channel, enhancement-mode type.

5. The voltage level translating circuit of claim 1 wherein said first and second load means respectively include third and fourth low threshold, metal oxide semiconductor transistors having source, gate and drain electrodes, said source electrodes forming said first terminals of said first and second load means, said gate and drain electrodes of each of said third and fourth transistors being connected together to form said second terminals of each of said load means.

6. A logic level translating circuit which responds to a logical "one" input signal to provide a first output level and to a logical "zero" input signal to provide a second output level, including in combination:

first and second low threshold, metal oxide semiconductor field effect transistors each having source, gate and drain electrodes, said drain electrode of the first transistor being connected to said source electrode of said second transistor, means connecting said source electrode of said first transistor and said drain electrode of said second transistor respectively to first and second voltage supplies, said gate electrode of said first transistor being directly connected to an input terminal and said gate electrode of said second transistor being connected to its drain to form a first load, said first transistor having a first conductance in response to the logical "zero" input signal to provide a first control signal at its drain electrode and a second conductance which is less than said first conductance in response to the logical "one" input signal to provide a second control signal at its drain electrode;

a third low threshold metal oxide semiconductor, field effect transistor having a gate electrode directly connected to both the input terminal and to said gate electrode of said first transistor, a source electrode connected to said drain electrode of said first transistor, and a drain electrode connected directly to an output terminal;

a fourth low threshold metal oxide semiconductor transistor having gate and drain electrodes connected to said second supply to form a second load and a source electrode connected directly to said drain electrode of said third transistor; and said third transistor being rendered conductive in response to said first control signal so that the first output level is applied from said first voltage supply through said third transistor to the output terminal, and said third transistor being rendered substantially nonconductive in response to said second control signal so that the second output level is applied from said voltage supply through said fourth transistor to the output terminal.

7. The logic translating circuit of claim 6 wherein said first load formed by said second transistor has substantially more resistance than said second load formed by said fourth transistor thereby enabling said first transistor to have a small geometry as compared to the geometry of said third transistor.

8. The logic level translating circuit of claim 6 wherein said third transistor includes a substrate terminal which is connected to said first voltage supply, said second control signal in cooperation with said first power supply voltage tending to reverse bias the source-to-substrate junction of said third transistor and thereby raise its threshold voltage in response to the logical "one" being applied to the input terminal.

* * * * *